United States Patent
Campbell et al.

(10) Patent No.: US 7,450,385 B1
(45) Date of Patent: Nov. 11, 2008

(54) LIQUID-BASED COOLING APPARATUS FOR AN ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/763,678

(22) Filed: Jun. 15, 2007

(51) Int. Cl.
  *H05K 7/20* (2006.01)
  *F28F 7/00* (2006.01)
(52) U.S. Cl. .................... 361/699; 165/80.4; 361/689
(58) Field of Classification Search ......... 361/688–689, 361/699; 454/184
  See application file for complete search history.

(56) References Cited

U.S. PATENT DOCUMENTS

| | | | | |
|---|---|---|---|---|
| 5,467,250 | A * | 11/1995 | Howard et al. ............... | 361/696 |
| 6,404,640 | B1 * | 6/2002 | Ishimine et al. ............. | 361/720 |
| 6,462,941 | B1 * | 10/2002 | Hulick et al. ............... | 361/683 |
| 6,646,879 | B2 * | 11/2003 | Pautsch ...................... | 361/699 |
| 6,927,980 | B2 * | 8/2005 | Fukuda et al. .............. | 361/700 |
| 7,286,356 | B2 * | 10/2007 | Keenan et al. .............. | 361/700 |
| 7,365,973 | B2 * | 4/2008 | Rasmussen et al. ......... | 361/694 |
| 7,380,409 | B2 * | 6/2008 | Campbell et al. ........... | 62/259.2 |
| 2005/0207116 | A1 * | 9/2005 | Yatskov et al. .............. | 361/690 |
| 2007/0035937 | A1 | 2/2007 | Colbert et al. | |
| 2007/0291452 | A1 * | 12/2007 | Gilliland et al. ............. | 361/699 |
| 2008/0018212 | A1 * | 1/2008 | Spearing et al. ............. | 312/236 |

OTHER PUBLICATIONS

Campbell et al., "Hybrid Cooling System and Method for a Multi-Component Electronics System", U.S. Appl. No. 11/539,902, filed Oct. 10, 2006.

(Continued)

*Primary Examiner*—Gregory D Thompson
(74) *Attorney, Agent, or Firm*—Lily Neff, Esq.; Kevin P. Radigan, Esq.; Heslin Rothenberg Farley & Mesiti P.C.

(57) ABSTRACT

A cooling apparatus is provided for facilitating cooling of electronics drawers of an electronics rack. The apparatus includes a bi-fold door assembly configured for mounting to the electronics rack. The door assembly includes a first door and a second door, each configured for separate, hinged mounting to the electronics rack. The apparatus further includes a coolant distribution apparatus, wherein a coolant supply manifold thereof is mounted to the first door and a coolant return manifold thereof is mounted to the second door. Separate swivel connections are coupled in fluid communication with the coolant supply and return manifolds for facilitating supply and return of coolant to and from the manifolds, and for facilitating pivotal movement of the doors relative to the electronics rack. A plurality of coolant distribution ports are provided within the supply and return manifolds, and disposed to facilitate supply and return of coolant to the electronics drawers.

20 Claims, 11 Drawing Sheets

OTHER PUBLICATIONS

Campbell et al., "Cooling System and Method for a Multi-Component Electronics System Employing Conductive Heat Transport", U.S. Appl. No. 11/539,905, filed Oct. 10, 2006.

Campbell et al., "Method of Assembling a Cooling System for a Multi-Component Electronics System", U.S. Appl. No. 11/539,907, filed Oct. 10, 2006.

Campbell et al., "Liquid-Based Cooling System for Cooling a Multi-Component Electronics System", U.S. Appl. No. 11/539,910, filed Oct. 10, 2006.

Colbert et al., "Heatsink Apparatus for Applying a Specified Compressive Force to an Integrated Circuit Device", U.S. Appl. No. 11/460,334, filed Jul. 27, 2006.

* cited by examiner

LIQUID-BASED COOLING APPARATUS FOR AN ELECTRONICS RACK

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Hybrid Cooling System and Method for a Multi-Component Electronics System", Campbell et al., Ser. No. 11/539,902, filed Oct. 10, 2006;

"Cooling System and Method for a Multi-Component Electronics System Employing Conductive Heat Transport", Campbell et al., Ser. No. 11/539,905, filed Oct. 10, 2006;

"Method of Assembling a Cooling System for a Multi-Component Electronics System", Campbell et al., Ser. No. 11/539,907, filed Oct. 10, 2006;

"Liquid-Based Cooling System for Cooling a Multi-Component Electronics System", Campbell et al., Ser. No. 11/539,910, filed Oct. 10, 2006;

"Method and Apparatus for Mounting a Heat Sink in Thermal Contact with an Electronic Component", Colbert et al, Ser. No. 11/201,972, filed Aug. 11, 2005, published on Feb. 15, 2007 as U.S. Patent Publication No. 2007/0035937 A1; and "Heatsink Apparatus for Applying a Specified Compressive Force to an Integrated Circuit Device", Colbert et al, Ser. No. 11/460,334, filed Jul. 27, 2006.

TECHNICAL FIELD

The present invention relates in general to cooling apparatuses for removing heat from electronic devices, modules and systems, and more particularly, to a cooling apparatus, cooled electronics system and method of fabrication thereof for extracting heat from heat generating components of one or more electronics subsystems of an electronics rack.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of air exhausted into the computer center.

In many large server applications, processors along with their associated electronics (e.g., memory, disk drives, power, etc.), are packaged in removable drawer configurations stacked or aligned within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, for example, through the use of a more powerful air moving device or by increasing the rotational speed (i.e., RPMs) of an existing air moving device. However, this approach is becoming unmanageable at the frame level in the context of a computer installation (e.g., data center).

The sensible heat load carried by the air exiting the frame will eventually exceed the ability of room air conditioning to effectively handle the load. This is especially true for large installations of "server farms" or large banks of computer frames close together. In such installations, not only will the room air conditioning be challenged, but the situation may also result in recirculation problems with some fraction of the "hot" air exiting one frame being drawn into the air inlet of the same or a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the conventional openings in the frame for the entry and exit of air flow make it difficult, if not impossible to provide effective acoustic treatment to reduce the acoustic noise level outside the frame. Finally, as operating frequencies continue to increase, electromagnetic cross talk between tightly spaced computer frames is becoming a problem largely due to the presence of the openings in the covers.

Accordingly, there is a significant need for enhanced cooling mechanisms for electronic components, individually and at all levels of packaging, including for example, rack-mounted or blade-mounted electronic components of various large computer systems today.

SUMMARY OF THE INVENTION

The need to cool current and future high heat load, high heat flux electronic components requires development of aggressive thermal management techniques, such as liquid-based cooling systems and methods of fabrication. The concepts disclosed herein address the need for enhanced liquid-based cooling apparatuses and fabrication methods thereof for facilitating cooling of a multi-component electronics system, such as an electronics rack comprising multiple electronics drawers or blades.

Briefly summarized, the present invention comprises in one aspect a cooling apparatus for an electronics system. The cooling apparatus includes a bi-fold door assembly and a coolant distribution apparatus. The bi-fold door assembly is configured for attachment to one of a front, back or side of an electronics rack, which includes a support structure supporting at least one electronics drawer. The bi-fold door assembly includes a first door and a second door, each door being configured for separate hinged mounting to the support structure of the electronics rack. The coolant distribution apparatus facilitates cooling of the at least one electronics drawer of the electronics rack, includes at least one coolant supply manifold and at least one coolant return manifold. The at least one coolant supply manifold is mounted to the first door of the bi-fold door assembly and the at least one coolant return manifold is mounted to the second door of the bi-fold door assembly. The coolant distribution apparatus further includes a coolant supply swivel connection and a coolant return swivel connection. The coolant supply swivel connection is coupled in fluid communication with the at least one coolant supply manifold, and the coolant return swivel connection is coupled in fluid communication with the at least one coolant return manifold. These swivel connections facilitate supply and return of coolant to or from the at least one coolant supply and return manifolds, and further facilitate pivotal movement of the first door and the second door relative to the electronics rack when the first and second doors are separately hingedly mounted to the support structure of the electronics rack. Further, the coolant distribution apparatus includes a plurality of coolant distribution ports within the at least one coolant supply and at least one coolant return manifolds. The plurality of coolant distribution ports are disposed within the at least one coolant supply and return manifolds to facilitate supply and return of coolant to the at least one electronics drawer of the electronics rack.

In another aspect, a cooled electronics system is provided which includes an electronics rack, a bi-fold door assembly and a coolant distribution apparatus. The electronics rack includes a support structure supporting at least one electronics drawer to be cooled. The bi-fold door assembly is attached to one of a front, back or side of the electronics rack, and includes a first door and a second door. Each door is separately, hingedly mounted to the support structure of the electronics rack at the front, back or side thereof. The coolant distribution apparatus facilitates cooling of the at least one electronics drawer of the electronics rack, and includes at least one coolant supply manifold and at least one coolant return manifold. The at least one coolant supply manifold is mounted to the first door of the bi-fold door assembly and the at least one coolant return manifold is mounted to the second door of the bi-fold door assembly. The coolant distribution apparatus further includes a coolant supply swivel connection and a coolant return swivel connection, as well as a plurality of coolant distribution ports. The coolant supply swivel connection is coupled in fluid communication with the at least one coolant supply manifold and the coolant return swivel connection is coupled in fluid communication with the at least one coolant return manifold for facilitating supply or return of coolant to or from, respectively, the at least one coolant supply manifold and the at least one coolant return manifold, and for facilitating pivotal movement of the first door and the second door relative to the electronics rack. The plurality of coolant distribution ports are disposed in the at least one coolant supply manifold and at least one coolant return manifold, and facilitate supply and return of coolant to the at least one electronics drawer. The cooled electronics system further includes a plurality of flexible hoses, each coupled in fluid communication with a coolant distribution port of one of the at least one coolant supply or return manifold and a respective coolant inlet or coolant outlet of an electronics drawer of the at least one electronics drawer of the electronics rack.

In still another aspect, a method of fabricating a cooling apparatus for an electronics system is provided. The method includes: providing a bi-fold door assembly configured for attachment to one of a front, back or side of an electronics rack, the electronics rack including a support structure supporting at least one electronics drawer, wherein the bi-fold door assembly comprises a first door and a second door, each door being configured for separate, hinged mounting to the support structure of the electronics rack at the one of the front, back or side of the electronics frame; providing a coolant distribution apparatus for facilitating cooling of the at least one electronics drawer of the electronics rack, the coolant distribution apparatus comprising at least one coolant supply manifold and at least one coolant return manifold; mounting the at least one coolant supply manifold within the first door of the bi-fold door assembly, and mounting the at least one coolant return manifold within the second door of the bi-fold door assembly; providing a coolant supply swivel connection coupled in fluid communication with the at least one coolant supply manifold, and a coolant return swivel connection coupled in fluid communication with the at least one coolant return manifold for facilitating supply and return of coolant to or from, respectively, the at least one coolant supply or coolant return manifolds, and for facilitating pivotal movement of the first door and the second door relative to the electronics rack when the first and second doors are separately, hingedly mounted to the support structure of the electronics rack; and wherein the at least one coolant supply manifold and at least one coolant return manifold include a plurality of coolant distribution ports, and wherein the at least one coolant supply manifold includes at least one coolant distribution port of the plurality of coolant distribution ports, and the at least one coolant return manifold includes at least one coolant distribution port of the plurality of coolant distribution ports, and wherein the plurality of coolant distribution ports facilitate supply and return of coolant to the at least one electronics drawer when the first and second doors are separately, hingedly mounted to the support structure of the electronics rack and the coolant distribution apparatus is coupled in fluid communication to facility coolant supply and return lines.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein "electronics system" comprises any system containing one or more heat generating components of a computer system or other electronics unit requiring cooling. The terms "electronics rack", "electronics frame", and "frame" are used interchangeably, and include any housing, rack, compartment, blade chassis, etc., having heat generating components of a computer system or electronics system and may be for example, a stand-alone computer processor having high, mid or low end processing capability. In one embodiment, an electronics frame comprises multiple electronics drawers, each having multiple heat generating components disposed therein requiring cooling. "Electronics drawer" refers to any sub-housing, blade, book, drawer, node, compartment, etc., having one or more heat generating electronic components disposed therein. Each electronics drawer of an electronics frame may be movable or fixed relative to the electronics frame, with rack mounted electronics drawers and blades of a blade center system being two examples of drawers of an electronics frame to be cooled.

"Electronic component" refers to any heat generating electronic component of, for example, a computer system or other electronics unit requiring cooling. By way of example, an electronic component may comprise one or more chips and/or other electronic devices to be cooled, including one or more processor modules, memory modules and memory support modules. As used herein, the term "liquid-cooled cold plate" refers to any conventional thermally conductive structure having a plurality of channels or passageways formed therein for flowing of liquid coolant therethrough.

Figure 1:
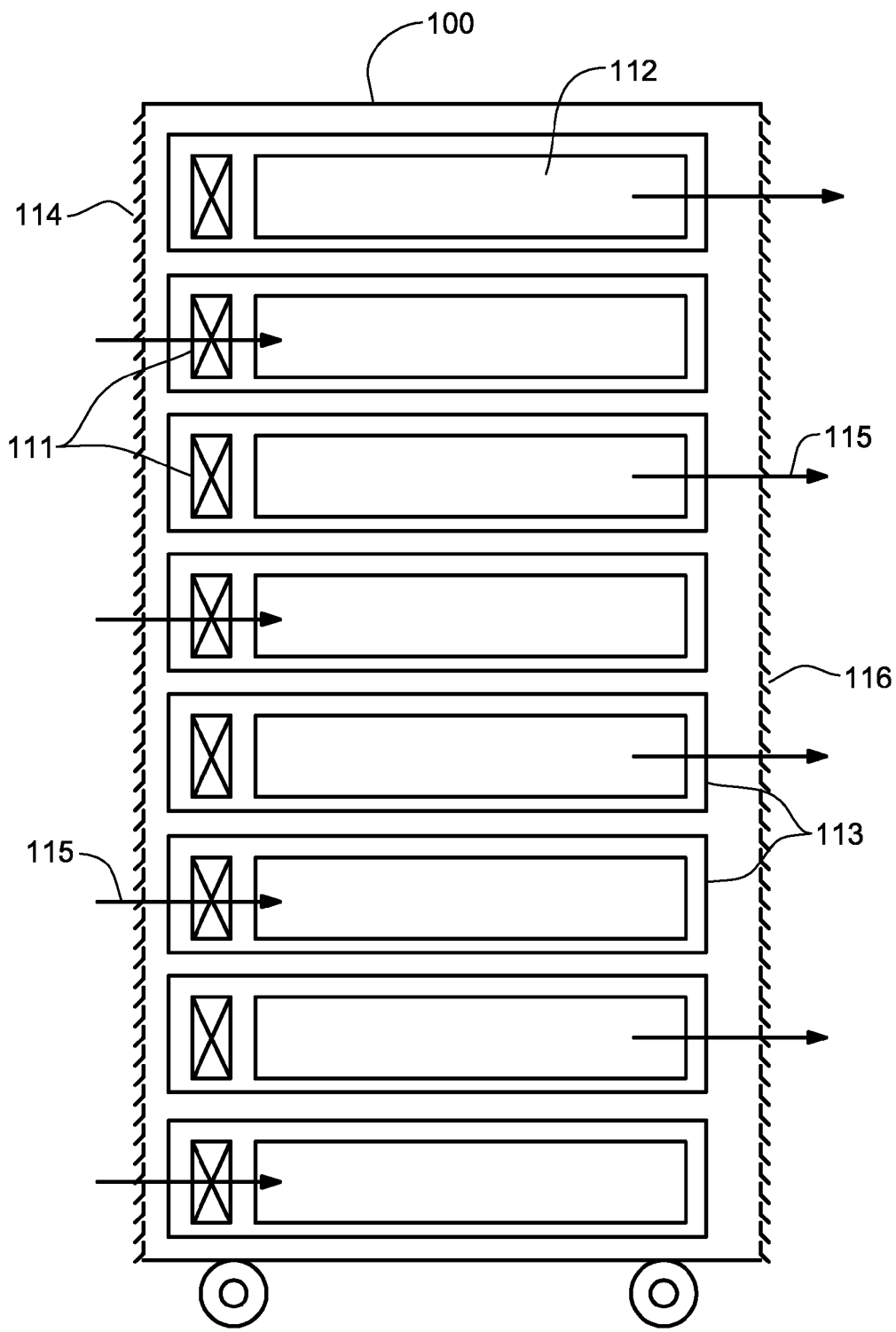
FIG. 1 depicts one embodiment of a conventional air-cooled electronics frame with heat generating electronic components disposed in removable electronics drawers.

As shown in FIG. 1, in rack-mounted configurations typical in the prior art, a plurality of air moving devices 111 (e.g., fans or blowers) provide forced air flow 115 needed to cool the electronic components 112 within the electronics drawers 113 of the frame 100. Cool air is taken in through a louvered inlet cover 114 in the front of the frame and exhausted out a louvered outlet cover 116 in the back of the frame.

Figure 2:
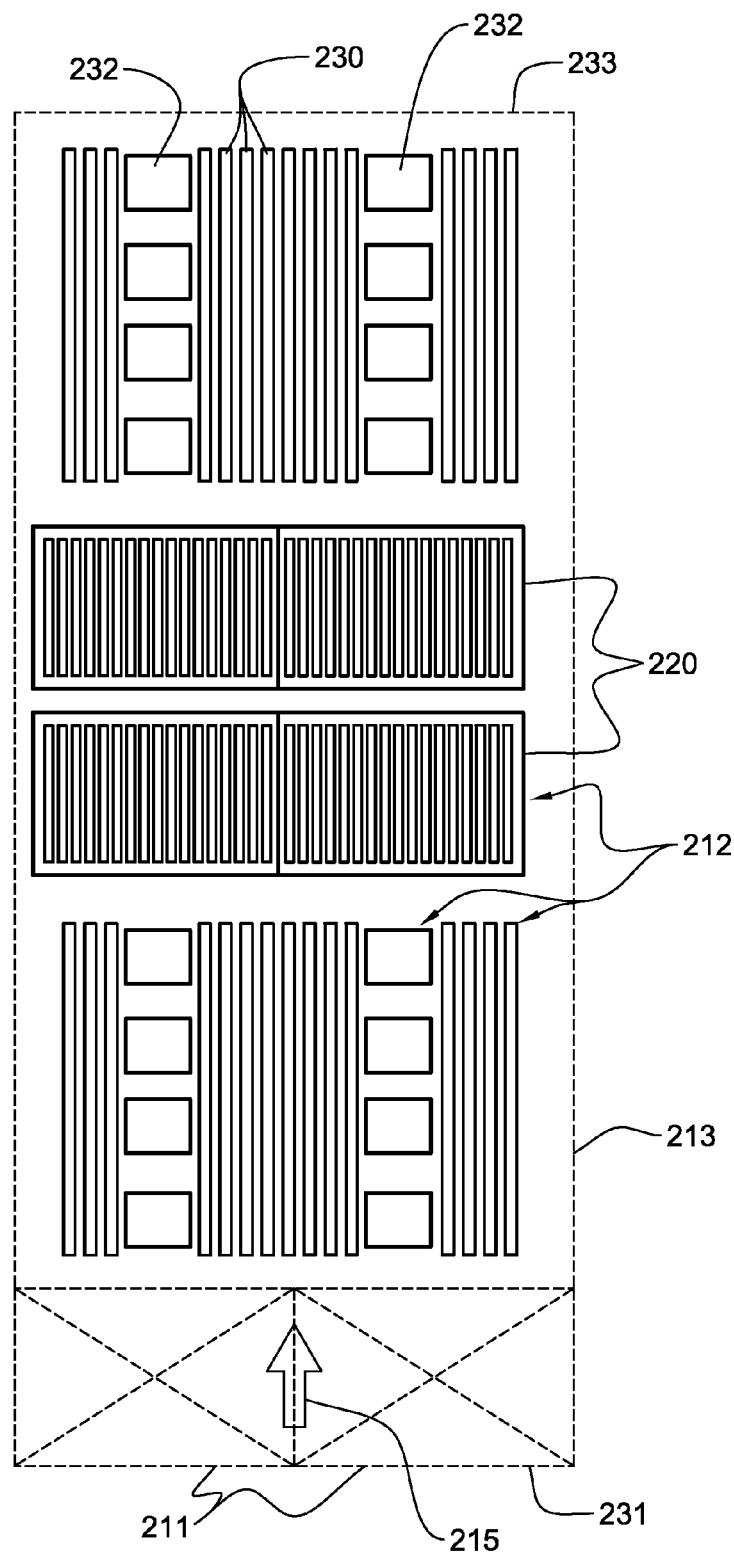
FIG. 2 is a plan view of one embodiment of an electronics drawer layout illustrating multiple electronic components to be cooled, in accordance with an aspect of the present invention.

FIG. 2 illustrates one embodiment of a multi-component electronics drawer 213 having a component layout in accordance with an aspect of the present invention. Electronics drawer 213 includes one or more air moving devices 211 (e.g., fans or blowers) which provide forced air flow 215 across the multiple electronic components 212 within electronics drawer 213. Cool air is taken in through a front 231 of electronics drawer 213 and exhausted out a back 233 of the electronics drawer. In this embodiment, the multiple electronic components to be cooled 212 include processor modules disposed below air-cooled heat sinks 220, as well as (by way of example) arrayed memory modules 230 (such as air-cooled dual in-line memory module (DIMM) packages) and multiple rows of memory support modules 232 disposed between the arrayed memory modules.

As noted above, in order to provide greater performance, it will eventually be necessary to increase processor chip powers beyond the point where forced air-cooling is feasible as a solution. Because of their level of power dissipation, the memory support modules and/or memory modules themselves may also require the application of auxiliary cooling to be effectively cooled. To meet these increased cooling demands, a cooling system may be provided with a liquid-based cooling subassembly including at least one liquid-cooled cold plate physically coupled to the at least one primary heat generating component (e.g., processor module) to be cooled.

Figure 3:
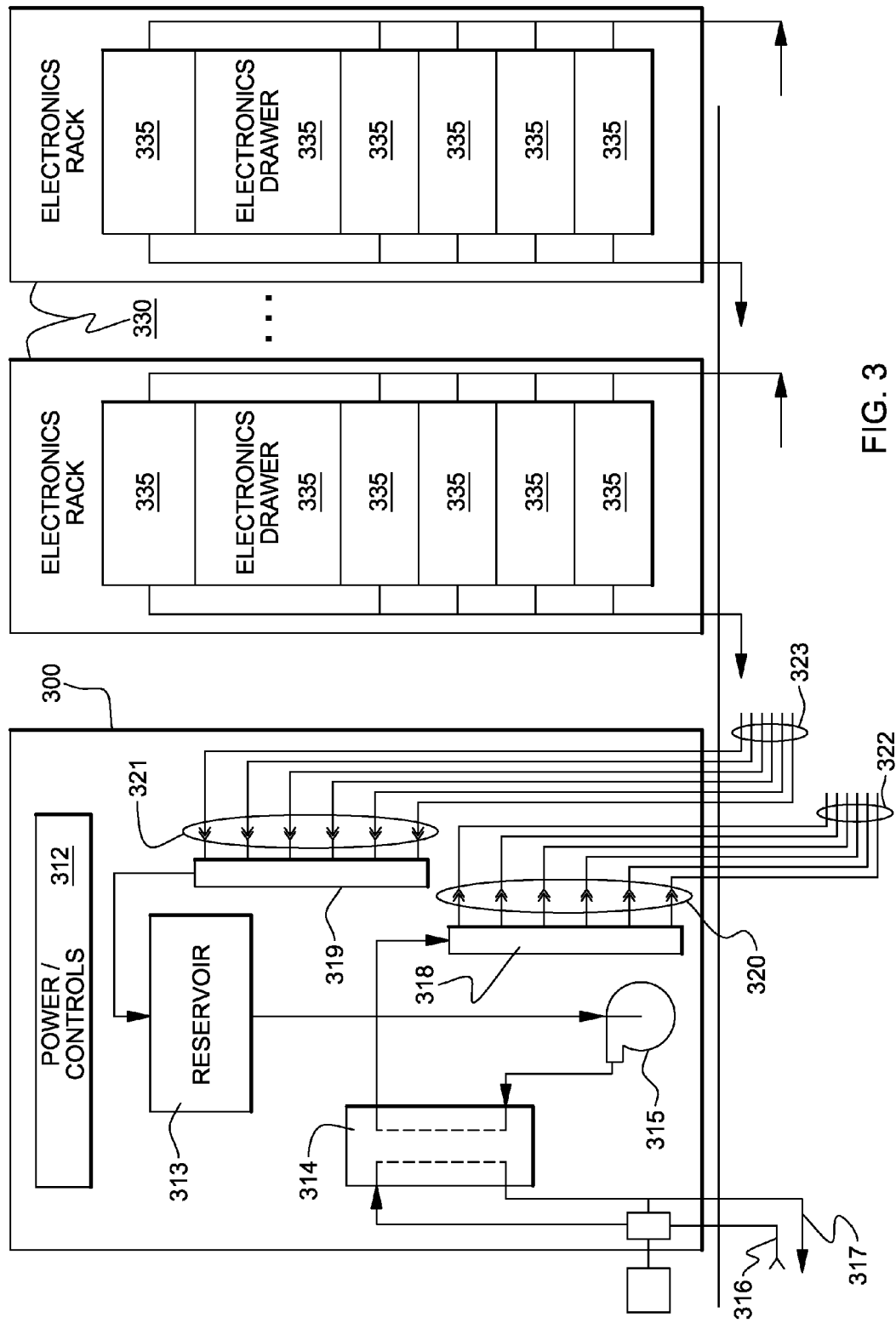
FIG. 3 depicts a coolant distribution unit, such as a computer room water conditioning unit (CRWCU), for facilitating cooling of one or more electronics racks of a computing environment.

FIG. 3 depicts one embodiment of a liquid-based coolant distribution unit 300 for a computer room comprising multiple electronics racks 330. Within coolant distribution unit 300 is a power/control element 312, a reservoir/expansion tank 313, a heat exchanger 314, a pump 315 (often accompanied by a redundant, second pump), facility water (or site or customer service water or coolant), inlet 316 and outlet 317 supply pipes, a supply manifold 318 directing water to the electronics frames 330 via couplings 320 and lines 322, and a return manifold 319 directing water from the electronics frames 330, via lines 323 and couplings 321. Each electronics rack 330 includes (in one example) multiple electronics drawers 335 comprising multiple electronics systems or subsystems.

Figure 4:
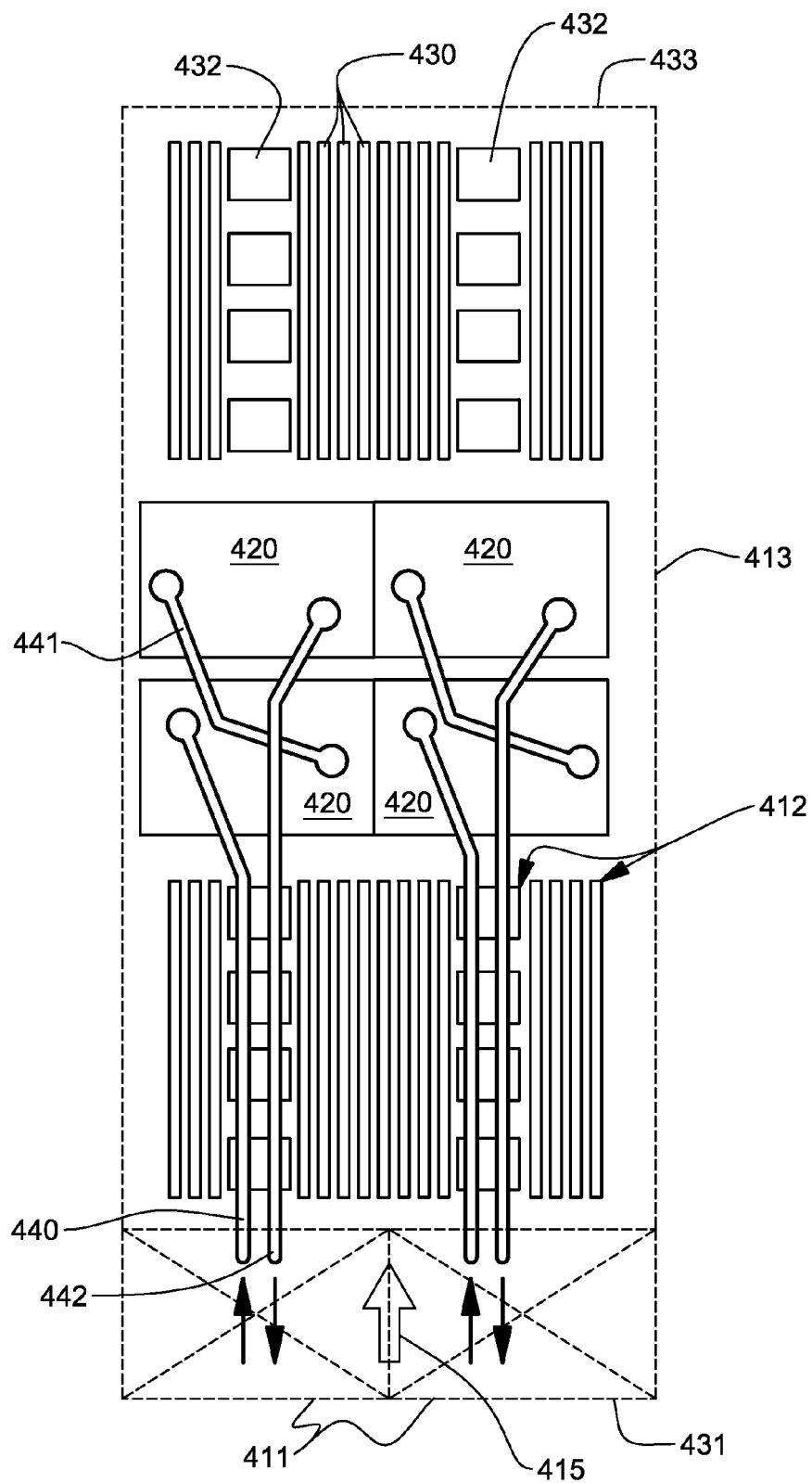
FIG. 4 is a plan view of the electronics drawer layout of FIG. 2 illustrating one embodiment of a cooling subsystem for cooling the components of the drawer, in accordance with an aspect of the present invention.

FIG. 4 is a depiction of the electronics drawer component layout of FIG. 2, shown with a liquid-based cooling subsystem supplied with coolant, for example, by a coolant distribution unit such as depicted in FIG. 3 and a cooling apparatus as described below with reference to FIGS. 7-11.

More particularly, FIG. 4 depicts one embodiment of an electronics drawer 413 component layout wherein one or more air moving devices 411 provide forced air flow 415 to cool multiple components 412 within electronics drawer 413. Cool air is taken in through a front 431 and exhausted out a back 433 of the drawer. The multiple components to be cooled include multiple processor modules to which liquid-cooled cold plates 420 are coupled, as well as multiple arrays of memory modules 430 (e.g., dual in-line memory modules (DIMMs)) and multiple rows of memory support modules 432 (e.g., DIMM control modules) to which air-cooled heat sinks are coupled. In the embodiment illustrated, memory modules 430 and the memory support modules 432 are partially arrayed near front 431 of electronics drawer 413, and partially arrayed near back 433 of electronics drawer 413. Also, in the embodiment of FIG. 4, memory modules 430 and the memory support modules 432 are cooled by air flow 415 across the electronics drawer.

In the embodiment of FIG. 4, the cooling system further includes multiple coolant-carrying tubes connected to and in fluid communication with liquid-cooled cold plates 420. The coolant-carrying tubes comprise sets of coolant-carrying tubes, with each set including a thermally conductive (for example) coolant supply tube 440 and a thermally conductive (for example) coolant return tube 442. In this example, each set of tubes provides liquid coolant to a pair of cold plates 420 (coupled to a pair of processor modules). Coolant flows into a first cold plate of the pair via the coolant supply tube 440 and from the first cold plate to the second cold plate via a bridge tube or line 441, which may or may not be thermally conductive. From the second cold plate of the pair, coolant is returned through the respective coolant return tube 442.

Figure 5:
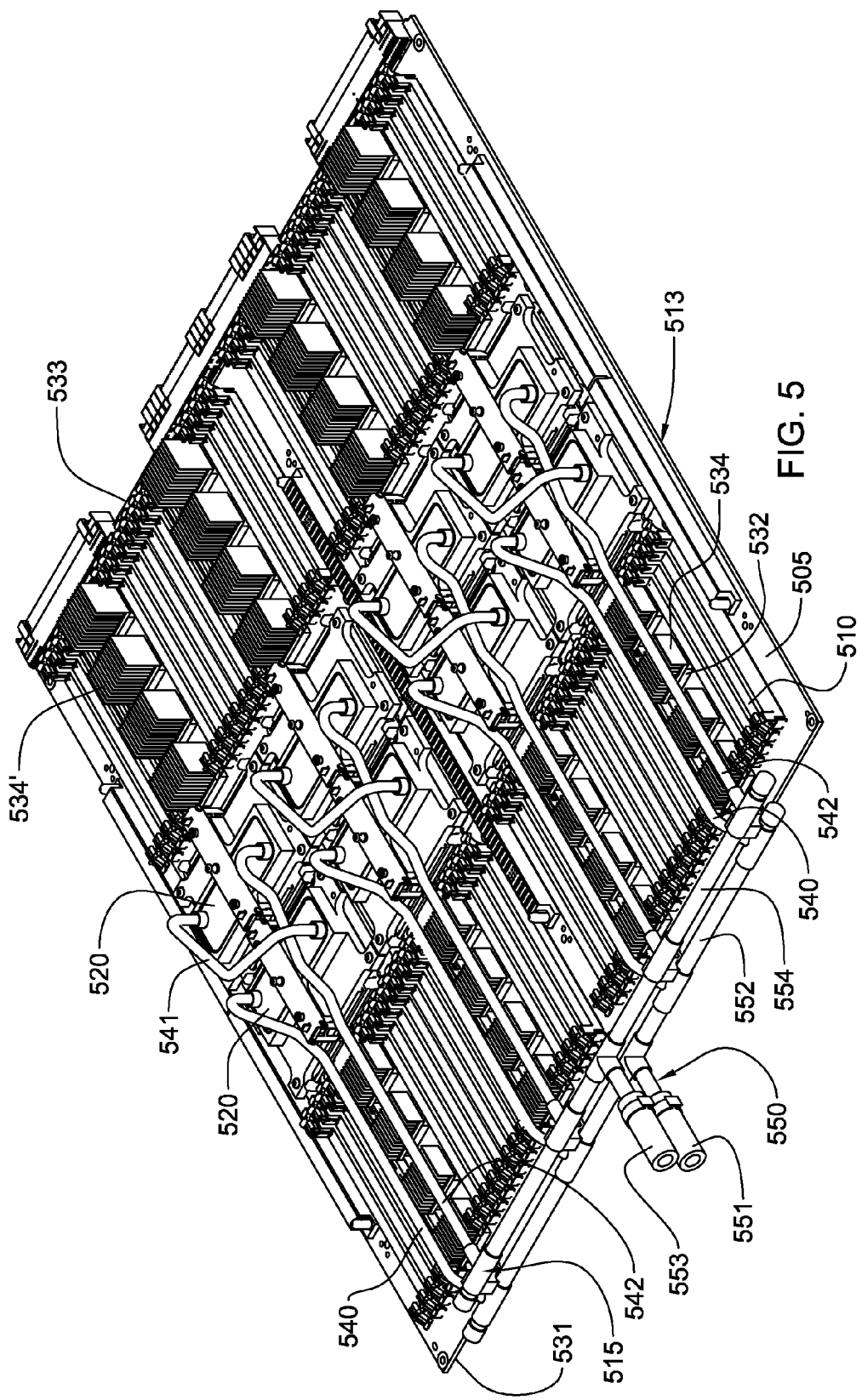
FIG. 5 depicts one embodiment of a partially assembled electronics system wherein eight primary heat generating components to be cooled have coupled thereto respective liquid-cooled cold plates of a liquid-based cooling subsystem, in accordance with an aspect of the present invention.

FIG. 5 depicts in greater detail an alternate electronics drawer layout comprising eight processor modules, each having a respective liquid-cooled cold plate of a cooling subsystem coupled thereto. The cooling subsystem further includes associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem may be chilled water.

FIG. 5 depicts a partially assembled electronics system 513 and a liquid-based cooling subsystem 515 coupled to the primary heat generating components (e.g., processor modules) to be cooled. In this embodiment, the electronics system includes, by way of example, a support substrate or motherboard 505, a plurality of memory module sockets 510, with the memory modules (e.g., dual in-line memory modules) not shown, multiple rows of memory support modules 532 (each having coupled thereto an air-cooled heat sink 534), and multiple processor modules (not shown) disposed below the liquid-cooled cold plates 520 of the liquid-based cooling subsystem 515. In addition to liquid-cooled cold plates 520, liquid-based cooling subsystem 515 includes multiple coolant-carrying tubes, including coolant supply tubes 540 and coolant return tubes 542 in fluid communication with respective liquid-cooled cold plates 520. The coolant-carrying tubes 540, 542 are also connected to a header (or manifold) subassembly 550 which facilitates distribution of liquid coolant to the coolant supply tubes and return of liquid coolant from the coolant return tubes 542. In this embodiment, the air-cooled heat sinks 534 coupled to memory support modules 532 closer to front 531 of electronics drawer 513 are shorter in height than the air-cooled heat sinks 534' coupled to memory support modules 532 near back 533 of electronics drawer 513. This size difference is to accommodate the coolant-carrying tubes 540, 542 since, in this embodiment, the header subassembly is at the front 531 of the electronics drawer and the multiple liquid-cooled cold plates 520 are in the middle of the drawer.

Figure 6A:
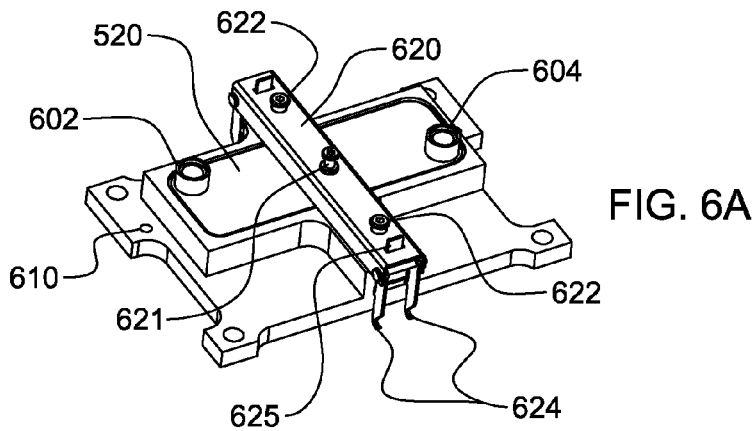
FIG. 6A depicts one embodiment of a liquid-cooled cold plate employed in the cooling subsystem embodiment of FIG. 5, in accordance with an aspect of the present invention.

Referring more particularly to FIGS. 5 & 6A, liquid-based cooling subsystem 515 includes multiple (pre-assembled) liquid-cooled cold plates 520. Each liquid-cooled cold plate 520 includes, in this embodiment, a liquid coolant inlet 602 (see FIG. 6A) and a liquid coolant outlet 604, as well as an attachment subassembly 620. The attachment subassembly 620 is employed to couple the liquid-cooled cold plate 520 to the associated processor module to form the cold plate and processor module assemblies depicted in FIG. 5. Alignment openings 610 are provided on either side of the cold plate for use in the assembly process, as described further below. Additionally, connectors 622 are included within attachment subassembly 620 which facilitate operation of the attachment assembly, as explained in detail in the above-incorporated application entitled "Liquid-Based Cooling System for Cooling a Multi-Component Electronics System". Further, attachment components 624 of attachment subassembly 620 are shown in FIG. 6A to extend below a lower surface of the liquid-cooled cold plate. Attachment subassembly 620 is shown to further include load actuation adjusters (e.g., load actuation screws) 621 for facilitating application of loading pressure against the cold plate and memory module assembly, and load arm engagement tabs 625 for facilitating engagement of the cold plate to the memory module.

Figure 6B:
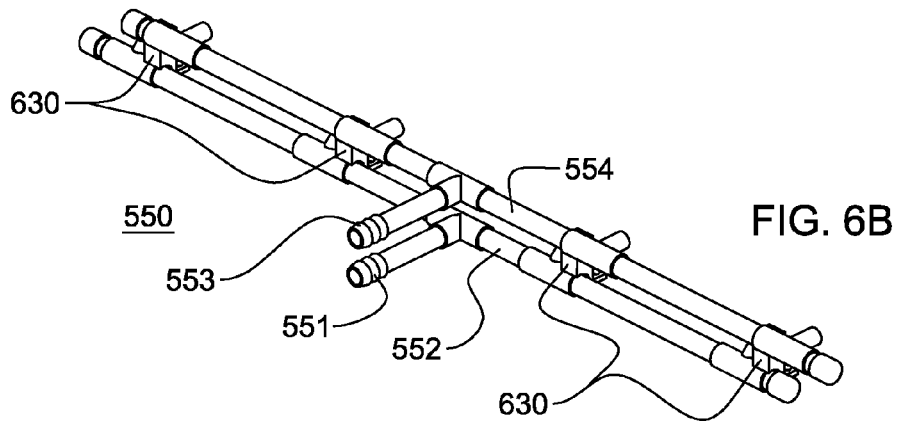
FIG. 6B depicts one embodiment of a header subassembly employed in the cooling subsystem embodiment of FIG. 5, in accordance with an aspect of the present invention.

As shown in FIGS. 5 & 6B, header subassembly 550 includes two liquid manifolds, i.e., a coolant supply header 552 and a coolant return header 554, which in one embodiment, are coupled together via supporting brackets 630. The coolant supply header 552 couples to each coolant supply tube 540, while the coolant return header 554 couples to each coolant return tube 552. A single coolant inlet 551 and a single coolant outlet 553 extend from the header subassembly for coupling to the electronics rack's coolant supply and return manifolds (not shown).

Figure 6C:
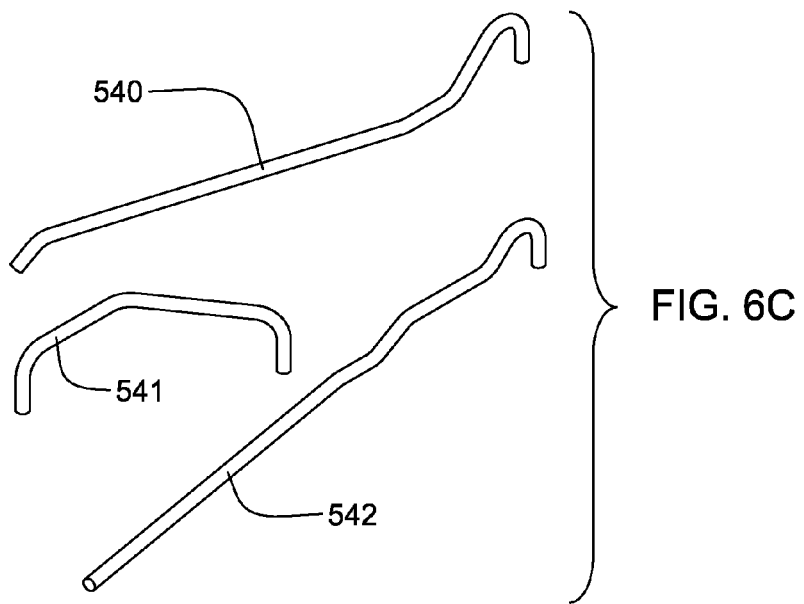
FIG. 6C depicts multiple preconfigured coolant-carrying tubes employed in the cooling subsystem embodiment of FIG. 5, in accordance with an aspect of the present invention.

FIGS. 5 & 6C depict one embodiment of the coolant-carrying tubes. In addition to coolant supply tubes 540 and coolant return tubes 542, bridge tubes or lines 541 are provided for coupling, for example, a liquid coolant outlet of one liquid-cooled cold plate to the liquid coolant inlet of another liquid-cooled cold plate in order to connect in series fluid flow two cold plates, with the two cold plates receiving liquid coolant from a respective set of coolant-carrying tubes. In this embodiment, the coolant supply tubes 540, bridge tubes 541 and coolant return tubes 542 are each preformed, substantially rigid tubes formed of a weldable, brazable or solderable material, such as copper or aluminum. The tubes are preformed to facilitate assembly of the liquid-based cooling system into a particular electronics system.

FIGS. 7-11 depict one embodiment of a cooling apparatus for an electronics rack for facilitating supply and return of liquid-based coolant to one or more liquid-based cooling subsystems, for example, such as depicted above in connection with FIGS. 4-6C.

As noted above, as servers continue to increase in performance and packaging density, the resultant high thermal dissipation requirements dictate a transition from air to liquid cooling, using (for example) a dielectric, refrigerant, water, or some other coolant having higher thermal conductivity and thermal capacity. Solutions utilizing a chilled, fluid to cool one or more microprocessors (for example) within an electronics drawer, either directly or by means of conduction cooling with a cold plate, present a problem of manifolding. Modular servers are commonly mounted in a rack with many more servers. Liquid-cooling servers within an electronics rack causes a liquid distribution problem, since many hoses are required to fluidically connect each of the electronics drawers (for example, servers within the drawers), to a coolant source and return. One solution is to employ a rack extender or external manifold, which increases the physical size of the rack and may cause interference issues for concurrent serviceability and limit access to the various wire connections, serviceable parts, etc., of the electronics rack. Thus, presented herein is a novel cooling apparatus wherein two or more manifolds are mounted within a bi-fold door assembly, which allows the cooling apparatus, and more particularly, the manifolding, to fit within a current electronics rack footprint without impacting serviceability of the rack.

Figure 7:
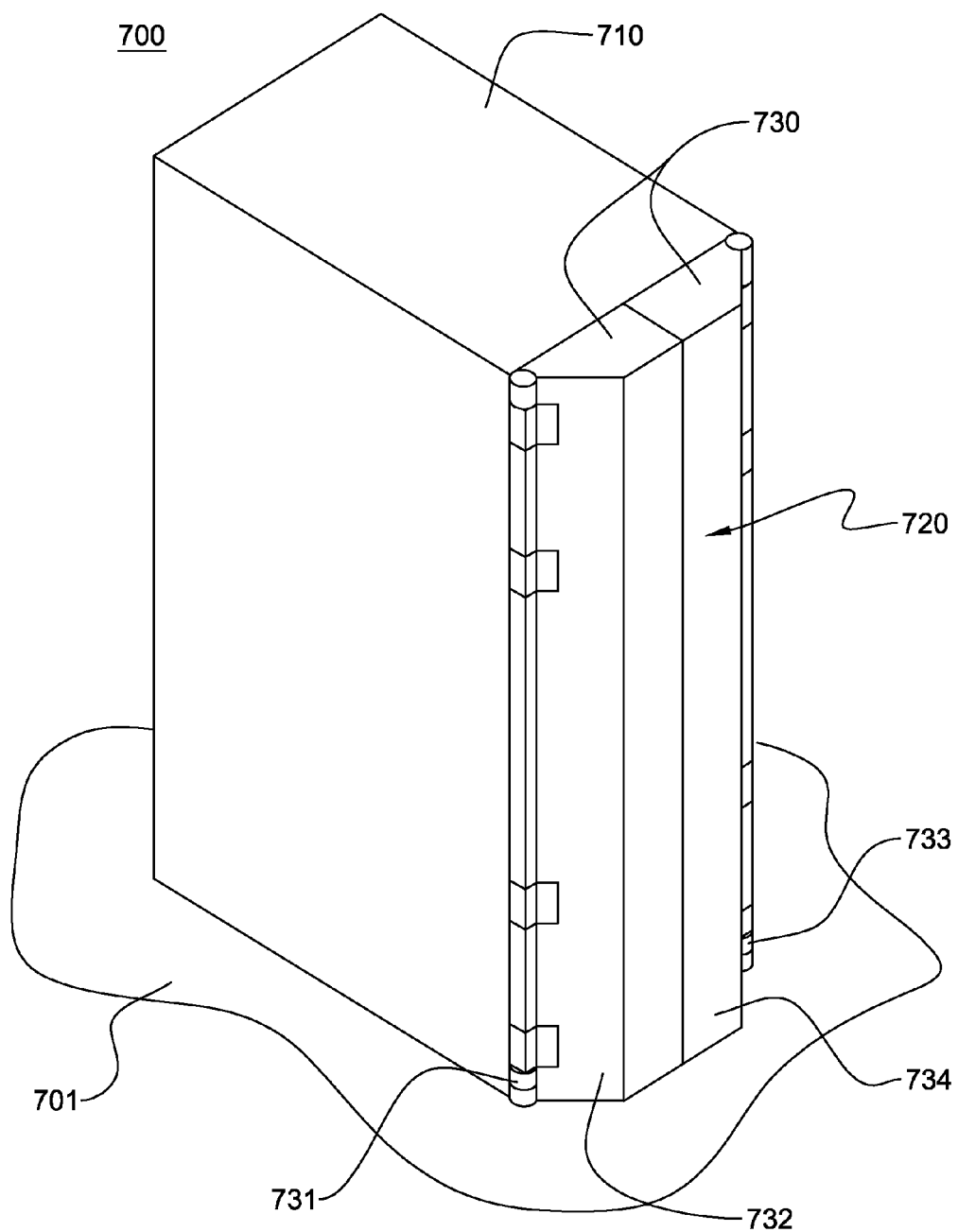
FIG. 7 depicts one embodiment of a cooled electronics system, comprising an electronics rack and a cooling apparatus, in accordance with an aspect of the present invention.

FIG. 7 depicts one embodiment of a cooled electronics system, generally denoted 700, in accordance with an aspect of the present invention. Cooled electronics system 700 includes an electronics rack 710 comprising one or more electronics drawers 900 (see FIG. 9). Additionally, a cooling apparatus 720 is provided hingedly mounted to one of a front, back or side of electronics rack 710. In the embodiment of FIGS. 7-11, the cooling apparatus is assumed to be mounted to a front or back of electronics rack 710, as illustrated. Cooling apparatus 720 includes a bi-fold door assembly 730 comprising a first door 732 and a second door 734. The first and second doors 732, 734 are substantially equally-sized door sections in this example, and together the first and second doors substantially cover the front or back of the electronics rack where mounted (although air flow vents within the doors could be provided to allow air flow therethrough). Each door separately, hingedly mounts 731, 733 to (for example) a respective edge of the support structure of the electronics rack 710, in this example at the front or back of the rack. The cooled electronics rack illustrated in FIG. 7 is positioned on a floor 701, such as a raised computer room floor wherein coolant is assumed to be provided through one or more distribution and return lines running below raised floor 701. Note that alternatively, in a non-raised floor embodiment, the coolant distribution and return lines to the individual electronics racks could be provided overhead.

Figure 8:
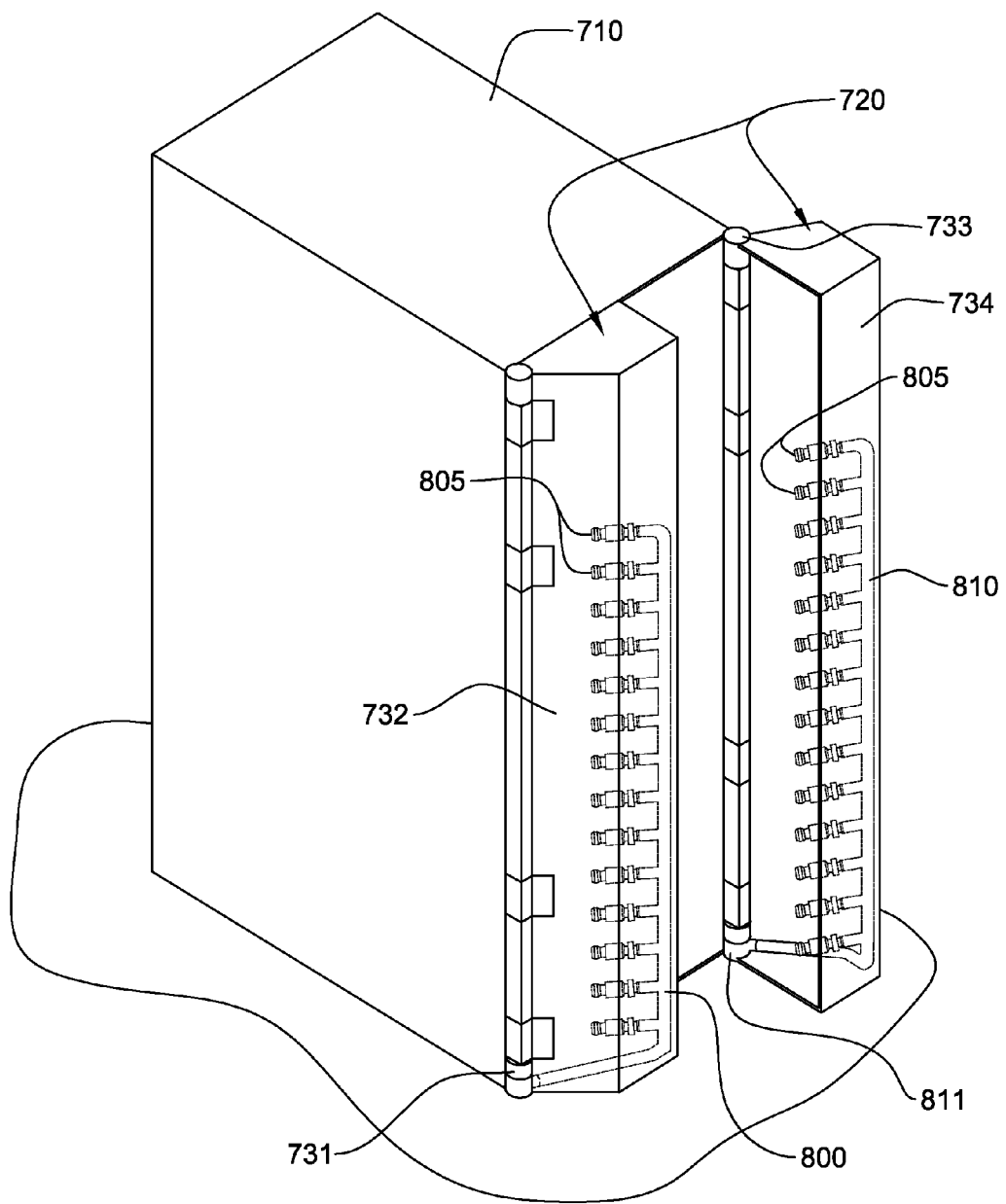
FIG. 8 depicts the cooled electronics system of FIG. 7, with one hingedly mounted door of the bi-fold door assembly of the cooling apparatus pivoted open, in accordance with an aspect of the present invention.

As shown in FIG. 8, cooling apparatus 720 includes a coolant distribution apparatus comprising at least one coolant supply manifold 800, and at least one coolant return manifold 810. The at least one coolant supply manifold is mounted within first door 732 and the at least one coolant return manifold is mounted within second door 734. In this embodiment, the at least one coolant supply manifold 800 and the at least one coolant return manifold 810 are each elongate manifolds disposed vertically within the respective doors and are both positioned distal from the respective hinge axes 731, 733 of the doors.

Those skilled in the art should note that although shown in FIGS. 7-11 as a single coolant supply manifold 800 and a single coolant return manifold 810, each manifold could be divided into two or more manifolds to provide two or more independent flow paths, as may be required for certain electronics systems to ensure availability should a cooling apparatus flow path fail. By providing two or more independent coolant flow paths, the entire electronics rack would not be affected, but only that portion of the electronics components being fed by a failed coolant flow path.

Also depicted in FIG. 8 are a plurality of connect couplings 805, which in this embodiment, are disposed adjacent to a plurality of coolant distribution ports 1001, 1011 (FIG. 10) arrayed along the at least one coolant supply manifold 800 and the at least one coolant return manifold 810. The coolant distribution ports are disposed along the supply and return manifolds to facilitate supply and return of coolant to the individual electronics drawers of the electronics rack. In one embodiment, there are fourteen coolant distribution ports arrayed on the at least one coolant supply manifold and fourteen coolant ports, arrayed on the at least one coolant return manifold for an electronics rack comprising fourteen separate electronics drawers. By way of further detail, the plurality of connect couplings 805 comprise a plurality of quick connect couplings, such as coupling NS6D17008, available from Colder Products, of St. Paul, Minn., or couplings BH3-60 and BH3-61, available from Parker Hannifin, Corp., of Cleveland, Ohio.

Figure 9:
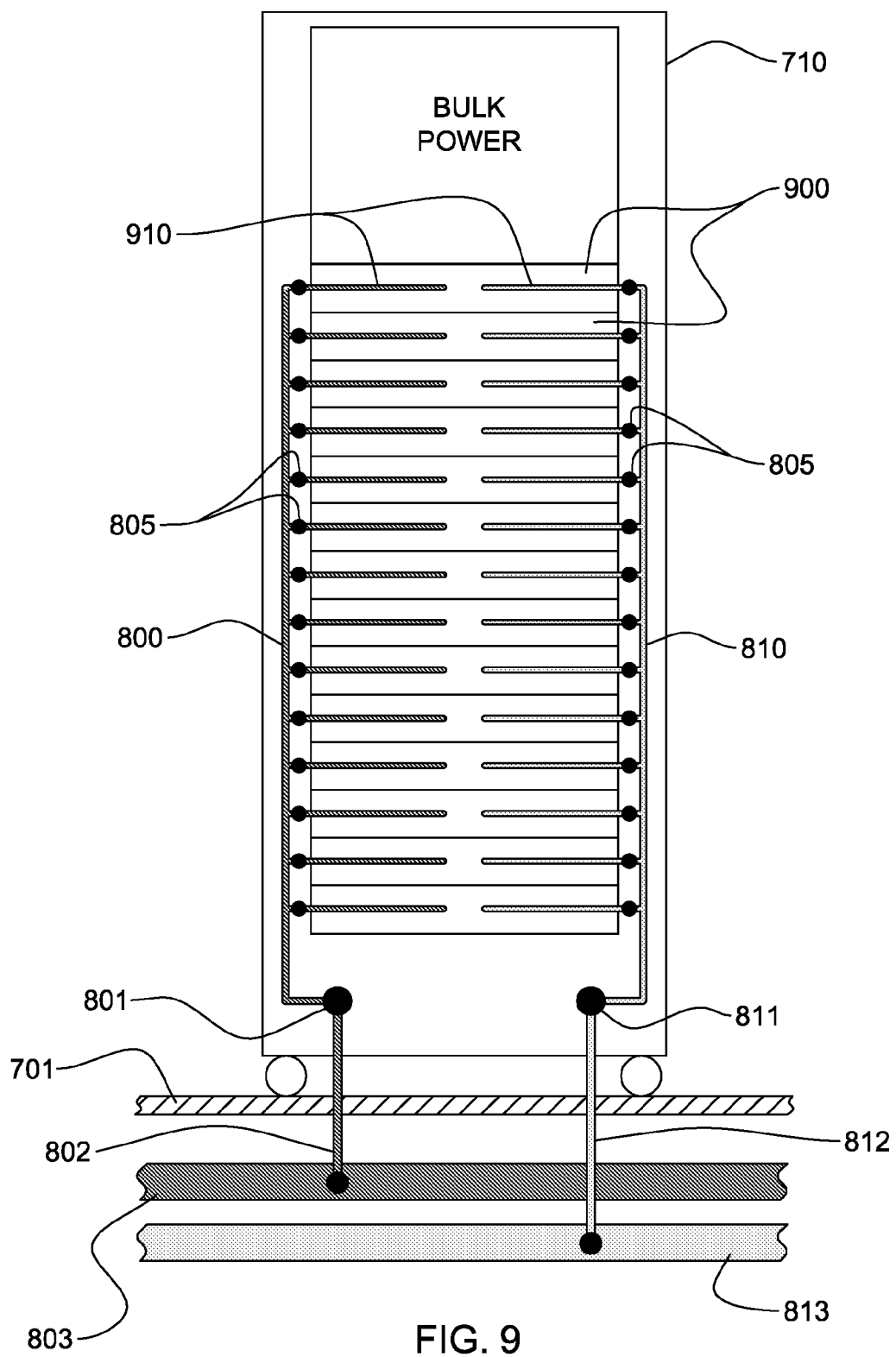
FIG. 9 is a schematic of coolant flow to and from electronics drawers of an electronics rack employing a cooling apparatus such as depicted in FIGS. 7 & 8, in accordance with an aspect of the present invention.

Additionally, as shown in FIG. 8, by providing hinge axes 731, 733 along the side edges of the electronics rack, the doors of the bi-fold door assembly swing outward away from each other to allow for access to the individual electronics drawers of the rack. As illustrated in FIG. 8, two swivel connections 801, 811 (illustrated in FIG. 9) are provided coaxially to the respective hinge axes 731, 733. These swivel connections allow manifolds 800, 810 to be in fluid communication with respective rack-level supply and return hoses/lines, as illustrated in FIG. 9, while still allowing the doors to readily pivot. By way of example, the swivel connections could comprise a PS1290102-12-12 connection, offered by Parker Hannifin, Corp., of Cleveland, Ohio, or alternatively, a 1817 series swivel connection offered by Eaton Corporation, of Eden Prairie, Minn.

As shown in FIG. 9, rack-level supply and return hoses 802, 812 are (in this embodiment) routed under the electronics rack through the raised floor 701 to respective coolant distribution lines 803, 813, which supply and return coolant to one or more coolant distribution units of the computing environment. As noted above, alternatively the rack-level supply and return hoses 802, 812 could extend upwards for piping to ceiling suspended distribution lines in a non-raised floor environment.

The cooling apparatus illustrated in FIG. 9 further includes a coolant supply swivel connection 801 in fluid communication with the at least one coolant supply manifold 800, and a coolant return swivel connection 811 in fluid communication with the at least one coolant return manifold 810. As noted, swivel connections 801, 811 facilitate supply and return of coolant to or from the coolant supply and return manifolds, respectively, and facilitate pivotal movement of the first and second doors relative to the electronics rack. In the embodiment of FIGS. 7-11, the swivel connections are provided near the bottom of each door, adjacent to the hinge axis thereof, in order that the rack-level supply and return hoses/lines 802, 812 will not hinder the opening or closing of the doors.

In the schematic of FIG. 9, although the bi-fold door assembly is not shown, the individual door sections are assumed pivoted open such that coolant supply manifold 800 and coolant return manifold 810 are disposed along the side edges of the electronics rack. In this open environment, flexible hoses 910 are illustrated to extend from respective coolant distribution ports, and in one embodiment, respective quick connect couplings 805, to a center region of the associated electronics drawer 900, for example, for coupling to a coolant inlet or coolant outlet 551, 553 (see FIG. 5) of a coolant supply header 552 or coolant return header 554, as described above in connection with FIGS. 5-6C.

Those skilled in the art should note that the quick connect couplings 805 referenced herein could alternatively be disposed at the coolant inlet or coolant outlet of the respective electronics drawer, or still further, at any location along the flexible hoses intermediate the coolant distribution ports and respective coolant inlet or outlet of the associated electronics drawer.

Figure 10:
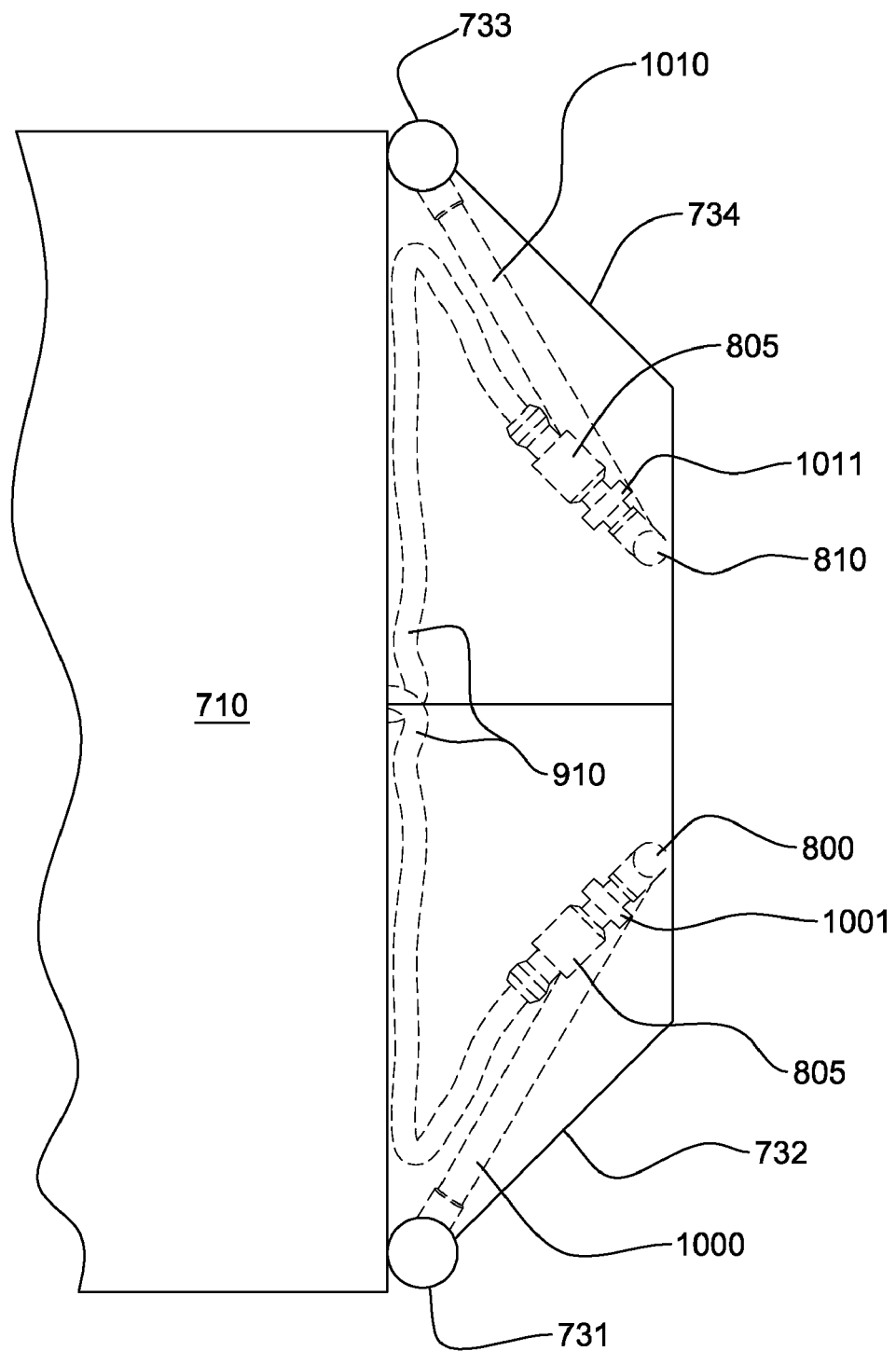
FIG. 10 is a partial plan view of the cooled electronics system of FIGS. 7 & 8, and illustrating positioning of a flexible hose coupling in fluid communication a quick connect coupling at a coolant distribution port of the coolant supply manifold and a coolant inlet of a respective electronics drawer of the electronics frame, as well as a flexible hose coupling in fluid communication a quick connect coupling at a coolant distribution port of the return manifold and a coolant outlet of the respective electronics drawer of the electronics frame, in accordance with an aspect of the present invention.
Figure 11:
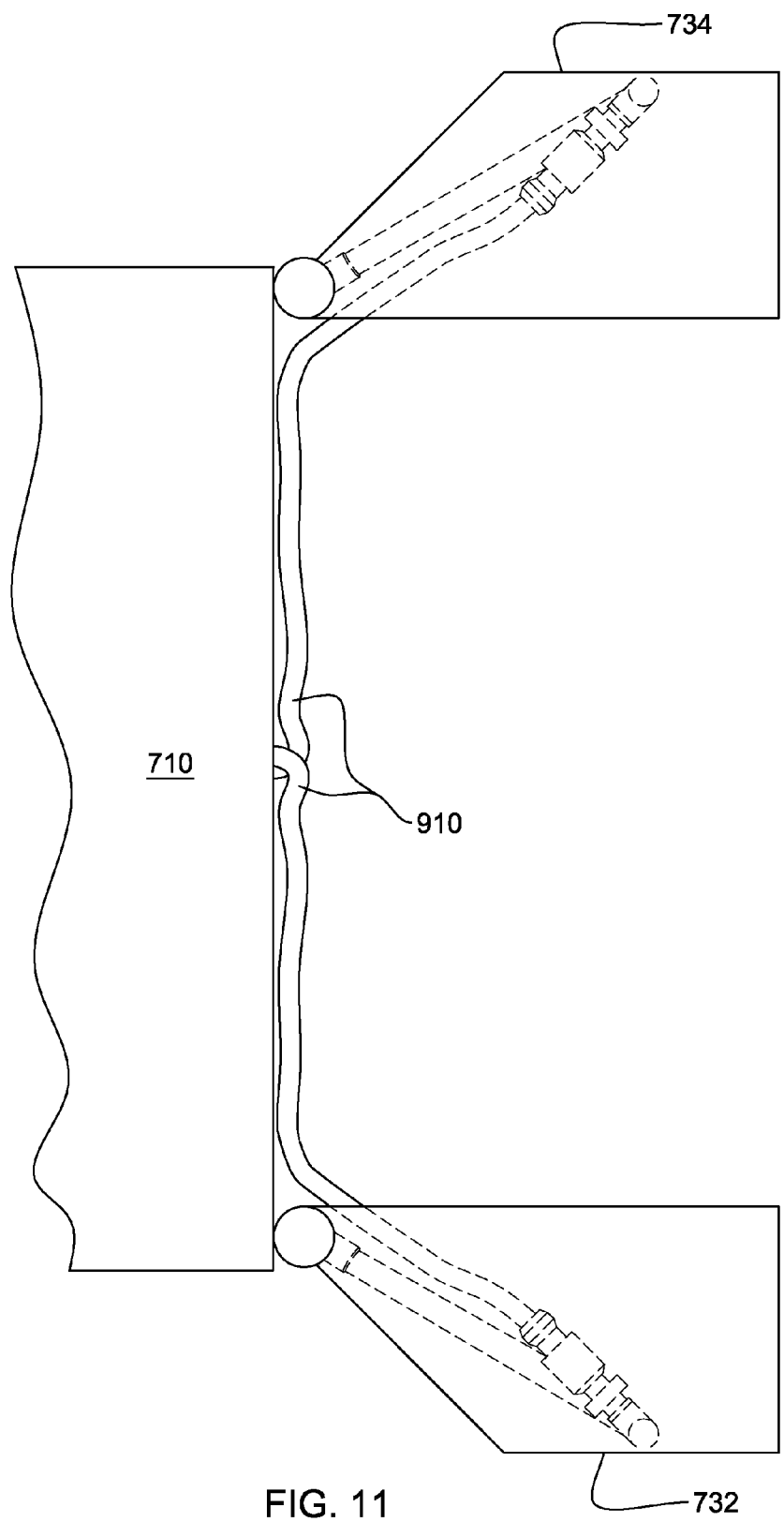
FIG. 11 is a plan view of the cooled electronics system of FIG. 10, showing the first door and second door pivoted open (with the illustrated flexible hoses stretched), to allow access to one or more electronics drawers of the electronics racks, in accordance with an aspect of the present invention.

FIGS. 10 & 11 are partial plan views of the cooled electronics system of FIGS. 7-9, wherein the coolant distribution apparatus is shown in dashed lines. As shown, coolant supply manifold 800 and coolant return manifold 810 are disposed distal the hinged connect axes 731, 733 for the individual doors 732, 734. More particularly, the manifolds 800, 810 are disposed near the middle of the front or back of the electronics rack to which the cooling apparatus is coupled. As shown in FIG. 10, the plurality of distribution ports arrayed along the supply and return manifolds extend back towards the respective hinged axes to allow the flexible hoses coupled to the coolant distribution ports to bend when in a closed position, as illustrated in FIG. 10, and stretched when the first and second doors 732, 734 are opened, as illustrated in FIG. 11. Additionally, although not shown, a wall within the inner door region of each door 732, 734 could be provided to further maintain the flexible hoses in a bent position, as illustrated in FIG. 10, when the doors are closed.

As illustrated, connect couplings 805 are attached to a respective coolant distribution port 1001 (on coolant supply manifold 800) or 1011 (on coolant return manifold 810). Additionally, coolant supply manifold 800 is fed via a supply line 1000 which extends from the coolant supply swivel connection 801 (FIGS. 8 & 9) to the manifold, and coolant returns from coolant return manifold 810 to the coolant return swivel connection 811 (FIGS. 8 & 9) via a return line 1010. In the raised floor embodiment, these supply and return lines 1000, 1010 are disposed in the lower portion of the respective first and second doors.

As noted, flexible hoses 910 are folded into cavities or door regions 1020 defined by the respective door and the front or back of electronics rack 710. In one embodiment, flexible hoses 910 may droop in the z-direction to ensure the proper length of tubing to allow the doors to fully open, as illustrated in FIG. 11. In the open position of FIG. 11, the individual electronics drawers of the electronics rack are accessible through the front or back of the rack to which the cooling apparatus is hingedly attached. This allows for selective decoupling of one or more electronics drawers from the cooling apparatus, for example, via use of the quick connect couplings, to thereby allow selective removal of one or more electronics drawers while retaining other electronics drawers within the electronics rack operational and actively liquid-cooled employing the cooling apparatus.

Advantageously, the cooling apparatus provided herein allows for coolant distribution without increasing the footprint of an electronics rack, and represents a compact design with a minimal change in electronics rack architecture.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus for an electronics system comprising:
   a bi-fold door assembly configured for attachment to one of a front, back or side of an electronics rack, the electronics rack including a support structure supporting at least one electronics drawer, wherein the bi-fold door assembly comprises a first door and a second door, each door being configured for separate hinged mounting to the support structure of the electronics rack at the one of the front, back or side of the electronics rack;
   a coolant distribution apparatus for facilitating cooling the at least one electronics drawer of the electronics rack, the coolant distribution apparatus comprising:
      at least one coolant supply manifold and at least one coolant return manifold, the at least one coolant supply manifold being mounted to the first door of the bi-fold door assembly, and the at least one coolant return manifold being mounted to the second door of the bi-fold door assembly;
      a coolant supply swivel connection coupled in fluid communication with the at least one coolant supply manifold, and a coolant return swivel connection coupled in fluid communication with the at least one coolant return manifold for facilitating supply or return of coolant to or from, respectively, the at least one coolant supply manifold and the at least one coolant return manifold, and for facilitating pivotal movement of the first door and the second door relative to the electronics rack when the first and second doors are separately, hingedly mounted to the support structure of the electronics rack; and
      a plurality of coolant distribution ports within the at least one coolant supply manifold and the at least one coolant return manifold, wherein the plurality of coolant distribution ports facilitate supply and return of coolant to the at least one electronics drawer.

2. The cooling apparatus of claim 1, further comprising a plurality of flexible hoses, each flexible hose coupling in fluid communication a respective coolant distribution port of the at least one coolant supply manifold or the at least one coolant return manifold with a coolant inlet or coolant outlet, respectively, of an associated electronics drawer of the at least one electronics drawer of the electronics rack to be cooled, and a plurality of quick connect couplings, each quick connect coupling being separately coupled in fluid communication to a respective flexible hose of the plurality of flexible hoses and disposed between the coolant distribution port and coolant inlet or coolant outlet of the associated electronics drawer, and each quick connect coupling facilitating coupling and decoupling of the respective coolant inlet or coolant outlet of the associated electronics drawer to the respective coolant distribution port of the at least one coolant supply manifold or the at least one coolant return manifold of the coolant distribution apparatus.

3. The cooling apparatus of claim 2, wherein the plurality of quick connect couplings are disposed at the coolant distribution ports, and wherein the coolant distribution ports are arrayed along the at least one coolant supply manifold and along the at least one coolant return manifold, which are mounted to the first and second doors, respectively, of the bi-fold door assembly.

4. The cooling apparatus of claim 2, wherein the first door and the second door extend outward from the electronics rack when separately, hingedly mounted thereto, and wherein the plurality of flexible hoses each fold into a respective door region of the first and second doors when the bi-fold door assembly is hingedly mounted to the support structure of the electronics rack and the first and second doors are in a closed position, and wherein the at least one coolant supply manifold and the at least one coolant return manifold mount to inner surfaces of the first door and the second door, respectively.

5. The cooling apparatus of claim 2, wherein the electronics rack comprises multiple electronics drawers, and wherein when the cooling apparatus is operationally mounted to the electronics rack, the plurality of quick connect couplings allow for decoupling of one electronics drawer of the multiple electronics drawers from the coolant distribution apparatus, while other electronics drawers of the multiple electronics drawers continue to receive coolant through the coolant distribution apparatus.

6. The cooling apparatus of claim 2, wherein the electronics rack comprises multiple electronics drawers, and wherein the cooling apparatus further comprises a liquid-based cooling subsystem within each electronics drawer of the multiple electronics drawers, each liquid-based cooling subsystem comprising at least one liquid-cooled cold plate connected to multiple coolant-carrying tubes in fluid communication with the at least one liquid-cooled cold plate, and including a header subassembly secured to the multiple coolant-carrying tubes, the header subassembly comprising a coolant supply header secured in fluid communication with at least one coolant supply tube of the multiple coolant-carrying tubes and a coolant return header secured in fluid communication with at least one coolant return tube of the multiple coolant-carrying tubes, wherein the coolant inlet and coolant outlet are in fluid communication with the coolant supply header and coolant return header, respectively, of the liquid-based cooling subsystem disposed within the associated electronics drawer.

7. The cooling apparatus of claim 1, wherein the at least one coolant supply manifold and the at least one coolant return manifold are each elongate manifolds mounted vertically within the first door or the second door, respectively, of the bi-fold door assembly, and wherein the first door and the second door are each configured for hinged, vertical mounting to the support structure of the electronics rack at the one of the front, back or side of the electronics rack.

8. The cooling apparatus of claim 1, wherein the bi-fold door assembly is configured for mounting to one of the front or back of the electronics rack, and wherein the first door and second door are substantially equally sized doors, and are configured for separate hinged, vertical mounting to respective edges of the support structure of the electronics rack about the one of the front or back of the electronics rack, and wherein the at least one coolant supply manifold and the at least one coolant return manifold of the coolant distribution apparatus are disposed within the first and second doors distal to the hinge axes thereof when the first and second doors are hingedly mounted to the electronics rack.

9. A cooled electronics system comprising:
   an electronics rack including a support structure supporting at least one electronics drawer to be cooled;
   a bi-fold door assembly attached to one of a front, back or side of the electronics rack, the bi-fold door assembly comprising a first door and a second door, each door being separately, hingedly mounted to the support structure of the electronics rack at the one of the front, back or side of the electronics rack;
   a coolant distribution apparatus for facilitating cooling of the at least one electronics drawer of the electronics rack, the coolant distribution apparatus comprising:
      at least one coolant supply manifold and at least one coolant return manifold, the at least one coolant supply manifold being mounted to the first door of the bi-fold door assembly and the at least one coolant return manifold being mounted to the second door of the bi-fold door assembly;
      a coolant supply swivel connection coupled in fluid communication with the at least one coolant supply manifold and a coolant return swivel connection coupled in fluid communication with the at least one coolant return manifold for facilitating supply and return of coolant to or from, respectively, the at least one coolant supply mandifold and return manifold, and for facilitating pivotal movement of the first door and the second door relative to the electronics rack;
      a plurality of coolant distribution ports within the at least one coolant supply manifold and the at least one coolant return manifold, wherein the plurality of coolant distribution ports facilitate supply and return of coolant to the at least one electronics drawer; and
      a plurality of flexible hoses, each flexible hose coupling in fluid communication a respective coolant distribution port of one of the at least one coolant supply or return manifolds with a respective coolant inlet or coolant outlet of an electronics drawer of the at least one electronics drawer of the electronics rack.

10. The cooled electronics system of claim 9, further comprising a plurality of quick connect couplings, each quick connect coupling being separately coupled in fluid communication to a respective flexible hose of the plurality of flexible hoses between the coolant distribution port and coolant inlet or coolant outlet of the associated electronics drawer.

11. The cooled electronics system of claim 10, wherein the plurality of quick connect couplings are disposed at the plurality of coolant distribution ports, and wherein the plurality of coolant distribution ports are arrayed along the at least one coolant supply manifold and along the at least one coolant return manifold, which are mounted to the first and second doors, respectively, of the bi-fold door assembly.

12. The cooled electronics system of claim 10, wherein the electronics rack comprises multiple electronics drawers, and wherein when operational, the plurality of coolant connect couplings allow for decoupling of one electronics drawer of the multiple electronics drawers from the coolant distribution apparatus, while other electronics drawers of the multiple electronics drawers continue to receive coolant through the coolant distribution apparatus.

13. The cooled electronics system of claim 9, wherein the first door and the second door extend outward from the electronics rack, and the plurality of flexible hoses each fold into a respective door region of the first and second doors when the first and second doors of the bi-fold door assembly are in a closed position, and wherein the at least one coolant supply manifold and the at least one coolant return manifold mount to inner surfaces of the first door and the second door, respectively.

14. The cooled electronics system of claim 9, wherein the at least one coolant supply manifold and the at least one coolant return manifold are each elongate manifolds mounted vertically within the first door and the second door, respectively, of the bi-fold door assembly, and wherein the first door and the second door are each hingedly, vertically mounted to the support structure of the electronics rack at the one of the front, back or side thereof.

15. The cooled electronics system of claim 9, wherein the coolant supply swivel connection and coolant return swivel connection axes are each disposed coaxially to a respective hinge axis of the first door and the second door.

16. The cooled electronics system of claim 9, wherein the bi-fold door assembly is mounted to one of the front or back of the electronics rack, and the first door and second door are substantially equally-sized doors, and are separately, hingedly vertically mounted to respective edges of the support structure of the electronics rack about the one of the front or back thereof, and wherein the at least one coolant supply manifold and the at least one coolant return manifold of the coolant distribution apparatus are disposed within the first and second doors distal to the hinge axes thereof.

17. The cooled electronics system of claim 9, wherein the electronics rack comprises multiple electronics drawers, and wherein the cooling apparatus further comprises a liquid-based cooling subsystem within each electronics drawer of the multiple electronics drawers, each liquid-based cooling subsystem comprising at least one liquid-cooled cold plate connected to multiple coolant-carrying tubes in fluid communication with the at least one liquid-cooled cold plate, and including a header subassembly secured to the multiple coolant-carrying tubes, the header subassembly comprising a coolant supply header secured in fluid communication with at least one coolant supply tube of the multiple coolant-carrying tubes and a coolant return header secured in fluid communication with at least one coolant return tube of the multiple coolant-carrying tubes, wherein the coolant inlet and coolant outlet are in fluid communication with the coolant supply header and coolant return header, respectively, of the liquid-based cooling subsystem disposed within the associated electronics drawer.

18. A method of fabricating a cooling apparatus for an electronics system, the method comprising:
   providing a bi-fold door assembly configured for attachment to one of a front, back or side of an electronics rack, the electronics rack including a support structure supporting at least one electronics drawer, wherein the bi-fold door assembly comprises a first door and a second door, each door being configured for separate, hinged mounting to the support structure of the electronics rack at the one of the front, back or side of the electronics frame;

providing a coolant distribution apparatus for facilitating cooling of the at least one electronics drawer of the electronics rack, the coolant distribution apparatus comprising at least one coolant supply manifold and at least one coolant return manifold;

mounting the at least one coolant supply manifold within the first door of the bi-fold door assembly, and mounting the at least one coolant return manifold within the second door of the bi-fold door assembly;

providing a coolant supply swivel connection coupled in fluid communication with the at least one coolant supply manifold, and a coolant return swivel connection coupled in fluid communication with the at least one coolant return manifold for facilitating supply and return of coolant to or from, respectively, the at least one coolant supply manifold and the at least one coolant return manifold, and for facilitating pivotal movement of the first door and the second door relative to the electronics rack when the first and second doors are separately, hingedly mounted to the support structure of the electronics rack; and wherein the at least one coolant supply manifold and at least one coolant return manifold comprise a plurality of coolant distribution ports, wherein the at least one coolant supply manifold comprises at least one coolant distribution port of the plurality of coolant distribution ports, and the at least one coolant return manifold comprises at least one coolant distribution port of the plurality of coolant distribution ports, and wherein the plurality of coolant distribution ports facilitate supply and return of coolant to the at least one electronics drawer when the first and second doors are separately, hingedly mounted to the support structure of the electronics rack and the coolant distribution apparatus is coupled in fluid communication to facility coolant supply and return lines.

19. The method of claim 18, wherein the electronics rack comprises multiple electronics drawers, and wherein the coolant supply manifold comprises a coolant distribution port for each electronics drawer of the multiple electronics drawers of the electronics rack, and the coolant return manifold comprises a coolant distribution port for each electronics drawer of the multiple electronics drawers of the electronics rack.

20. The method of claim 19, wherein the mounting of the at least one coolant supply and return manifolds comprises mounting the at least one coolant supply manifold vertically within the first door distal a hinge axis thereof and mounting the at least one coolant return manifold vertically within the second door distal a hinge axis thereof.

* * * * *